US009882355B2

(12) United States Patent
Gerlach et al.

(10) Patent No.: US 9,882,355 B2
(45) Date of Patent: Jan. 30, 2018

(54) VERTICAL CAVITY SURFACE EMITTING LASER

(71) Applicant: KONINKLIJKE PHILIPS N.V., Eindhoven (NL)

(72) Inventors: Philipp Henning Gerlach, Ulm (DE); Roland Aloisius Jaeger, Neu-Ulm (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 0 days.

(21) Appl. No.: 15/506,032

(22) PCT Filed: Sep. 3, 2015

(86) PCT No.: PCT/EP2015/070158
§ 371 (c)(1),
(2) Date: Feb. 23, 2017

(87) PCT Pub. No.: WO2016/045935
PCT Pub. Date: Mar. 31, 2016

(65) Prior Publication Data
US 2017/0302059 A1 Oct. 19, 2017

(30) Foreign Application Priority Data
Sep. 25, 2014 (EP) .................................... 14186343

(51) Int. Cl.
*H01S 5/42* (2006.01)
*H01S 5/187* (2006.01)
(Continued)

(52) U.S. Cl.
CPC .............. *H01S 5/423* (2013.01); *H01S 5/026* (2013.01); *H01S 5/183* (2013.01); *H01S 5/187* (2013.01);
(Continued)

(58) Field of Classification Search
CPC ........ H01S 5/026; H01S 5/0262; H01S 5/042; H01S 5/125; H01S 5/18; H01S 5/183;
(Continued)

(56) References Cited

U.S. PATENT DOCUMENTS 5,132,982 A 7/1992 Chan et al.
5,216,686 A 6/1993 Holm et al.
(Continued)

FOREIGN PATENT DOCUMENTS

WO 2011018734 A1 2/2011
WO 2014088502 A1 6/2014

*Primary Examiner* — Armando Rodriguez

(57) ABSTRACT

The invention describes a Vertical Cavity Surface Emitting Laser and a method of manufacturing such a Vertical Cavity Surface Emitting Laser. The Vertical Cavity Surface Emitting Laser comprising a first electrical contact (105, 405, 505, 605, 705), a substrate (110, 410, 610, 710), a first distributed Bragg reflector (115, 415, 615, 715), an active layer (120, 420, 620, 720), a distributed heterojunction bipolar phototransistor (125, 425, 625, 725), a second distributed Bragg reflector (130, 430, 630, 730) and a second electrical contact (135, 435, 535, 635, 735), the distributed heterojunction bipolar phototransistor (125, 425, 625, 725) comprising a collector layer (125a), a light sensitive layer (125c), a base layer (125e) and an emitter layer (125f), wherein the distributed heterojunction bipolar phototransistor (125, 425, 625, 725) is arranged such that there is an optical coupling between the active layer (120, 420, 620, 720) and the distributed heterojunction bipolar phototransistor (125, 425, 625, 725) for providing an active carrier confinement by means of the distributed heterojunction bipolar phototransistor (125, 425, 625, 725) such that an optical mode of the Vertical Cavity Surface Emitting Laser is self-positioning in accordance with the active carrier confinement during operation of the Vertical Cavity Surface Emitting Laser. It is the intention of the present invention to
(Continued)

provide a VCSEL which can be easily and reliably processed by integrating the distributed heterojunction bipolar phototransistor (125, 425, 625, 725).

12 Claims, 8 Drawing Sheets

(51) Int. Cl.
*H01S 5/183* (2006.01)
*H01S 5/30* (2006.01)
*H01S 5/026* (2006.01)

(52) U.S. Cl.
CPC ...... *H01S 5/18305* (2013.01); *H01S 5/18369* (2013.01); *H01S 5/18386* (2013.01); *H01S 5/305* (2013.01); *H01S 5/42* (2013.01)

(58) Field of Classification Search
CPC ... H01S 5/40; H01S 5/42; H01S 5/423; H01S 5/18305; H01S 5/18369; H01S 5/18386; H01S 5/187; H01S 5/305
See application file for complete search history.

(56) References Cited

U.S. PATENT DOCUMENTS

| | | |
|---|---|---|
| 5,239,550 A | 8/1993 | Jain |
| 5,283,447 A | 2/1994 | Olbright et al. |
| 5,331,659 A | 7/1994 | Ohata et al. |
| 5,404,373 A | 4/1995 | Cheng |
| 5,596,595 A | 1/1997 | Tan et al. |
| 5,625,636 A | 4/1997 | Bryan et al. |
| 5,892,786 A | 4/1999 | Lott |
| 2003/0021322 A1 | 1/2003 | Steinle et al. |
| 2012/0128020 A1 | 5/2012 | Gerlach |

VERTICAL CAVITY SURFACE EMITTING LASER

CROSS-REFERENCE TO PRIOR APPLICATIONS

This application is the U.S. National Phase application under 35 U.S.C. § 371 of International Application No. PCT/EP2015/070158, filed on Sep. 3, 2015, which claims the benefit of European Patent Application No. 14186343.1, filed on Sep. 25, 2014. These applications are hereby incorporated by reference herein.

FIELD OF THE INVENTION

The invention relates to a Vertical Cavity Surface Emitting Laser (VCSEL) comprising a distributed heterojunction bipolar phototransistor and a corresponding method of fabricating such a VCSEL.

BACKGROUND OF THE INVENTION

State-of-the-art vertical-cavity surface-emitting lasers (VCSELs) as described, for example, in U.S. Pat. No. 5,596,595 need a current aperture for electrical and optical confinement. This is usually realized by lateral oxidation of a high aluminum containing layer. The lateral oxidation may cause reliability issues.

US 2012/0128020 A1 discloses to integrate a phototransistor layer structure into the layer stack of a Vertical Cavity Surface Emitting Laser (VCSEL).

SUMMARY OF THE INVENTION

It's thus an object of the present invention to provide a VCSEL with improved reliability.

According to a first aspect a Vertical Cavity Surface Emitting Laser is provided. The Vertical Cavity Surface Emitting Laser comprises a first electrical contact, a substrate, a first distributed Bragg reflector (DBR), an active layer, a distributed heterojunction bipolar phototransistor, a second distributed Bragg reflector (DBR) and a second electrical contact. The distributed heterojunction bipolar phototransistor comprises a collector layer, a light sensitive layer, a base layer and an emitter layer. The distributed heterojunction bipolar phototransistor is arranged such that there is an optical coupling between the active layer and the distributed heterojunction bipolar phototransistor for providing an active carrier confinement by means of the distributed heterojunction bipolar phototransistor such that an optical mode of the Vertical Cavity Surface Emitting Laser is self-positioning in accordance with the active carrier confinement during operation of the Vertical Cavity Surface Emitting Laser.

The term "layer" does not exclude that the layer comprises two or more sub-layers. The usage of a monolithically integrated distributed heterojunction bipolar phototransistor (HBT) close to the active area may enable an efficient carrier confinement by controlling the carrier injection as a function of the local intensity of the actual profile of the lasing mode. As a result, the carrier injection may be adapted locally to the demand of the lasing mode and vice versa. Furthermore, the HBT with optical sensitive collector-base junction can be designed such that little optical absorption and high current gain can be realized with moderate doping concentrations in the emitter layer. The light sensitive layer may be a quantum well layer or a bulk layer. Bulk layers are, for example, homogeneous layers with a thickness of 10 nm or more in which quantum mechanic effects can be neglected.

The HBT is arranged within the VCSEL such that the sensitivity with respect to light which is generated by means of the active layer of the VCSEL in combination with the optical resonator provided by the first and second DBR is sufficiently high. The HBT may, for example, be a pnp HBT which is arranged directly above the active layer meaning at the side of the active layer which is turned away from the usually n-conducting substrate. In an alternative approach it may be possible to arrange a npn HBT directly below the active layer. Directly means in this respect that the pnp HBT or the npn HBT is arranged as near as possible to the active layer. This does not exclude that there is one or more intermediate layer which may be needed to improve, for example, the performance and/or reliability of the VCSEL. It may also be possible to stack the HBT in the first or the second DBR after, for example, three or five pairs of mirror layers. The layer structure of the HBT may even be integrated in the one of the DBR. The thickness of one or more of the HBT layers may be adapted to the emission wavelength of the VCSEL (quarter wavelength layer). One or more layers of the HBT may in this case be used to increase the reflectivity of the respective DBR. It may even be possible to use two HBTs one below and one above the active layer.

Positioning of the HBT directly above or below the active layer may have the advantage that due to the low lateral conductivity between the HBT and the active layer the optical mode fits best to the profile of the respective charge carriers.

The concentration of dopants in the collector layer, the base layer and the emitter layer is less than $10^{19}$ cm$^{-3}$. The dopants of the layers of the HBT cause optical losses such that a low doping level is preferred. The emitter layer of the HBT is the layer with the highest doping concentration. The concentration of dopants in the emitter layer may be, for example as low as $5*10^{18}$ cm$^{-3}$ or even $2*10^{18}$ cm$^{-3}$. The concentration of dopants may be as low as $1*10^{18}$ cm$^{-3}$ in the base layer and $4*10^{17}$ cm$^{-3}$ in the collector layer in case of a concentration of dopants of $2*10^{18}$ cm$^{-3}$ in the emitter layer in order to reduce optical losses by means of the charge carriers.

The thickness of the base layer may be 100 nm or less. The HBT may be a pnp HBT which is arranged between the active layer and the second DBR. The base layer may in this case have a thickness of around $\lambda/4$ of the emission wavelength of the VCSEL in the material of the base layer. The emission wavelength may depend on the material of the substrate. A GaAs substrate may be used for a emission wavelength between 650 nm and around 1600 nm. A VCSEL with a InP substrate may emit laser light at an emission wavelength of more than or even much more than 1500 nm. The thickness of the collector layer may be in the range of $\lambda/2$ of the emission wavelength of the VCSEL.

The current amplification (ratio between an electron current from the base layer to emitter layer and a hole current from emitter layer to collector layer) of the distributed heterojunction bipolar phototransistor is 100 or more. A high current amplification may have the advantage that a small base current is sufficient to get a high emitter current. The base current depends on the absorption of light by means of the light sensitive layer of the heterojunction bipolar phototransistor. A heterojunction bipolar phototransistor with a high current amplification would thus be very sensitive with respect to light generated by means of the active layer or more general the light generated by means of the VCSEL.

The latter may have a strong influence with respect to threshold voltage, slope and efficiency of the VCSEL.

The current gain of a conventional bipolar transistor is approximately given by the ratio of doping concentration in the emitter layer divided by doping concentration in the base layer. A current gain of 100 does require an emitter doping of at least factor 100 more than base doping. Useful values for base doping are $10^{18}$ cm$^{-3}$, which results in quite high emitter doping concentration of $100*10^{18}$ cm$^{-3}$=$10^{20}$ cm$^{-3}$. At the same time, the emitter layer needs a thickness of at least 100 nm to make the conventional bipolar transistor work. This means that quite a lot of doping in the emitter layer is needed which adds significant amount of free carrier absorption to the VCSEL cavity. This may cause reduced efficiency of the VCSEL.

The distributed heterojunction bipolar phototransistor may have the advantage that the current amplification can be controlled by means of a height of the step of the heterojunction. The influence of the doping concentration of the layers is thus not that important to control the current amplification. Current amplifications of 200, 300, 400, 500 or even 1000 or more may thus be possible without a high concentration of dopants which may cause absorption of light and thus reduce efficiency.

The distributed heterojunction bipolar phototransistor may be arranged to be electrically conductive without light emission of the Vertical Cavity Surface Emitting Laser at a defined threshold voltage such that light emission of the Vertical Cavity Surface Emitting Laser can be initiated by applying a voltage equal to or above the threshold voltage. The current flow via the HBT is primarily determined by means of the light emitted by the active layer. This means that there is no current as long there is no light and vice versa. The VCSEL may be started by arranging the HBT in a way that the HBT opens above a predetermined threshold voltage. The threshold voltage may, for example, be determined by an emitter-collector breakdown voltage of the distributed heterojunction bipolar phototransistor. The emitter-collector breakdown voltage may be equal to or less than 10 V.

There are different methods to achieve a low emitter-collector breakdown voltage as, for example, low base doping or high collector doping or low base thickness. The threshold voltage of the heterojunction bipolar phototransistor may be 5 V, 3 V, 2V or less. The HBT will let current pass, in case the voltage reaches the threshold voltage. This initial-current generates initial photons that will open the distributed heterojunction bipolar phototransistor.

Alternatively, it may even be possible to use the leakage current of the distributed heterojunction bipolar phototransistor in order to start the VCSEL. The leakage current may be used to generate light in the active layer as soon as a voltage above the threshold voltage is applied to the VCSEL. This spontaneously emitted light may be sufficient to open the distributed heterojunction bipolar phototransistor as described above. It would in this case not be necessary to apply a voltage above the emitter-collector breakdown voltage such that a voltage of 1 V may be sufficient to start the VCSEL.

The Vertical Cavity Surface Emitting Laser does not need a current aperture in order to get an acceptable current confinement. The current aperture is in case of a top emitting VCSEL usually integrated in the second DBR above the active layer and formed by oxidation of the so called current confinement layer. The current confinement layer should be near to the active layer in order to match the current distribution to the optical mode of the VCSEL. A current confinement layer is not needed in a VCSEL comprising a distributed heterojunction bipolar phototransistor as described above. It's thus not necessary to design a first or second DBR which is electrically conductive in order to enable a current flow via the current aperture. The first distributed Bragg reflector or the second distributed Bragg reflector may thus be arranged such that there is no current flow through the first distributed Bragg reflector or the second distributed Bragg reflector during operation of the Vertical Cavity Surface Emitting Laser. No current may flow across the second DBR if the VCSEL is designed as top emitting VCSEL in which the HBT is arranged between the active layer and the second DBR. The HBT may in this case be directly connected by means of the second electrical contact. The second DBR may comprise pairs of non-conducting dielectric layers with different refractive indices as, for example, $Nb_2O_5$, $TiO_2$, $TaO_2$, $Si_3N_4$ and $SiO_2$ layers.

The distributed heterojunction bipolar phototransistor may be arranged between the active layer and second distributed Bragg reflector, and a reflectivity of the second distributed Bragg reflector may be arranged such that laser light is emitted via the second distributed Bragg reflector during operation of the Vertical Cavity Surface Emitting Laser. The VCSEL emits in this case laser light in the direction away from the substrate. The VCSEL would be a so called top emitter.

The distributed heterojunction bipolar phototransistor may be arranged between the first distributed Bragg reflector and the active layer, and a reflectivity of the first distributed Bragg reflector is arranged such that laser light is emitted via the first distributed Bragg reflector during operation of the Vertical Cavity Surface Emitting Laser. The VCSEL emits in this case laser light in the direction of the substrate. The substrate thus needs to be either transparent at the emission wavelength of the VCSEL or the substrate has to be removed locally such that there is an emission window. The VCSEL would be a so called bottom emitter.

A laser arrangement may comprise at least two Vertical Cavity Surface Emitting Lasers as described above, wherein the Vertical Cavity Surface Emitting Lasers share the first distributed Bragg reflector and the second distributed Bragg reflector such that the second electrical contacts the Vertical Cavity Surface Emitting Lasers are arranged on a common surface. The Vertical Cavity Surface Emitting Laser of the laser arrangement further share the layers which are arranged between the first and the second distributed Bragg reflector as, for example, the active layer and the layers of the distributed heterojunction bipolar phototransistor. No oxidation of the layers of the second DBR is needed in order to provide a current aperture in a current confinement layer. Therefore no mesa etch is needed such that the at least two VCSEL can share the second DBR. The second electrical contact may be deposited directly on top of the second DBR. Alternatively, it may be possible to provide intermediate layer or layers between the second DBR and the second electrical contact. It may be possible to arrange three, four, five or even an array of a multitude of VCSEL in such a monolithic arrangement. The production of VCSEL arrays may thus be simplified and the risks of the mesa etch and subsequent oxidation may be avoided.

A reflectivity of the second distributed Bragg reflector may be in such a monolithic arrangement of two or more VCSEL locally increased at at least two different areas of the second distributed Bragg reflector such that during operation the Vertical Cavity Surface Emitting Lasers start lasing at the areas of increased reflectivity. A localized surface etch may be, for example, helpful to ensure the laser mode to start lasing at the desired lateral position.

A grating may be provided at the areas of increased reflectivity such that polarization stable single mode emission of the Vertical Cavity Surface Emitting Lasers is enabled. The shallow etch which may be used to provide the areas of increased reflectivity may also be used to provide a shape of a localized grating to define the polarization of the VCSEL mode.

A monolithic arrangement of lasers may also be possible if the first distributed Bragg reflector or the second distributed Bragg reflector comprises pairs of dielectric layers which are not electrically conductive as discussed above. A laser arrangement may comprise, for example, at least two of such Vertical Cavity Surface Emitting Lasers. The Vertical Cavity Surface Emitting Lasers may share the distributed heterojunction bipolar phototransistor. The Vertical Cavity Surface Emitting Lasers may further share the active layer. The laser arrangement may comprise three, four, five or even an array of a multitude of VCSELs. The mirror layers of the second DBR of the VCSELs may, for example, be deposited and the contacts to the HBT may be provided by means of masking prior to deposition or etching after deposition. The reflectivity of the second DBR may be locally increased by providing, for example, at least one addition pair of layers of the dielectric materials at predefined position such that it is ensured that the laser mode starts lasing at the desired lateral position of each VCSEL of the laser arrangement.

According to a second aspect a method of fabricating a Vertical Cavity Surface Emitting Laser is provided. The method comprises the steps of:
  providing a first electrical contact,
  providing a substrate,
  providing a first distributed Bragg reflector,
  providing an active layer,
  providing a distributed heterojunction bipolar phototransistor comprising a collector layer, a light sensitive quantum well layer, a base layer and an emitter layer, wherein the concentration of dopants in the collector layer, the base layer and the emitter layer is less than $10^{19}$ cm$^{-3}$,
  providing a second distributed Bragg reflector,
  providing a second electrical contact,
  arranging the distributed heterojunction bipolar phototransistor such that there is an optical coupling between the active layer and the distributed heterojunction bipolar phototransistor for providing an active carrier confinement by means of the distributed heterojunction bipolar phototransistor such that an optical mode of the Vertical Cavity Surface Emitting Laser is self-positioning in accordance with the active carrier confinement during operation of the Vertical Cavity Surface Emitting Laser, and arranging a current amplification (ratio between an electron current from the base layer to emitter layer and a hole current from emitter layer to collector layer) of the distributed heterojunction bipolar phototransistor is at least 100.

The steps need not necessarily be performed in the order given above. The substrate may, for example, be provided in a first step and the first electrical contact in a second step. The distributed heterojunction bipolar phototransistor may be provided within the first DBR, between the first DBR and the active layer, between the active layer and the second DBR or within the second DBR. The different layers may be deposited by epitaxial methods like MOCVD and the like.

It shall be understood that the VCSEL and the method disclosed herein have similar and/or identical embodiments. Furthermore, the method according to the inventions herein may be used to manufacture a laser arrangement according to the inventions herein.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first VCSEL with distributed HBT

Figure 2:
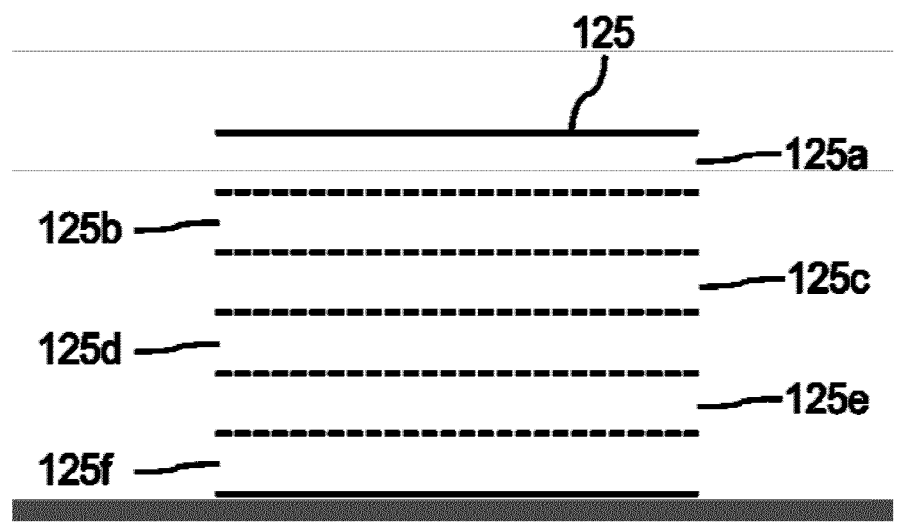
Figure 3:
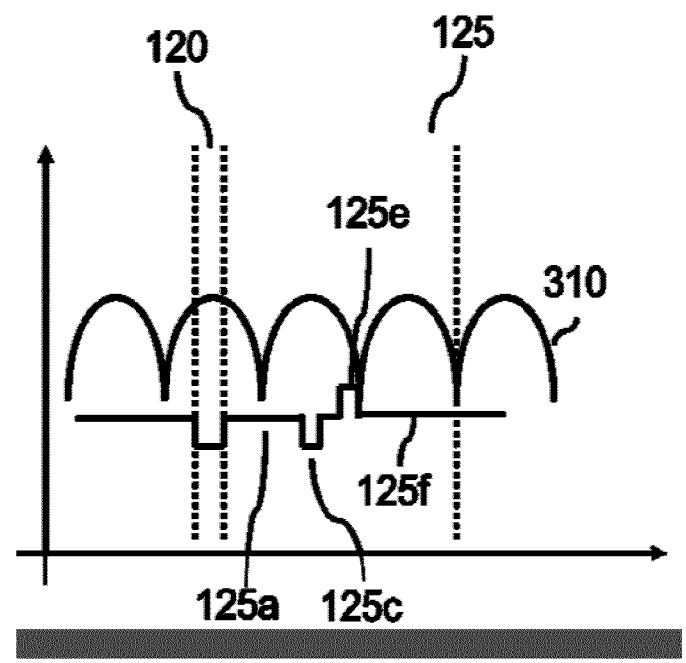
Figure 4:
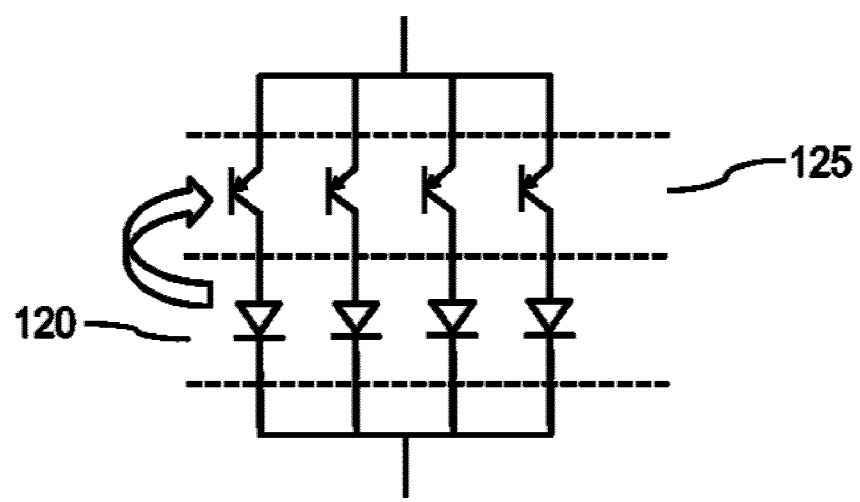
Figure 5:
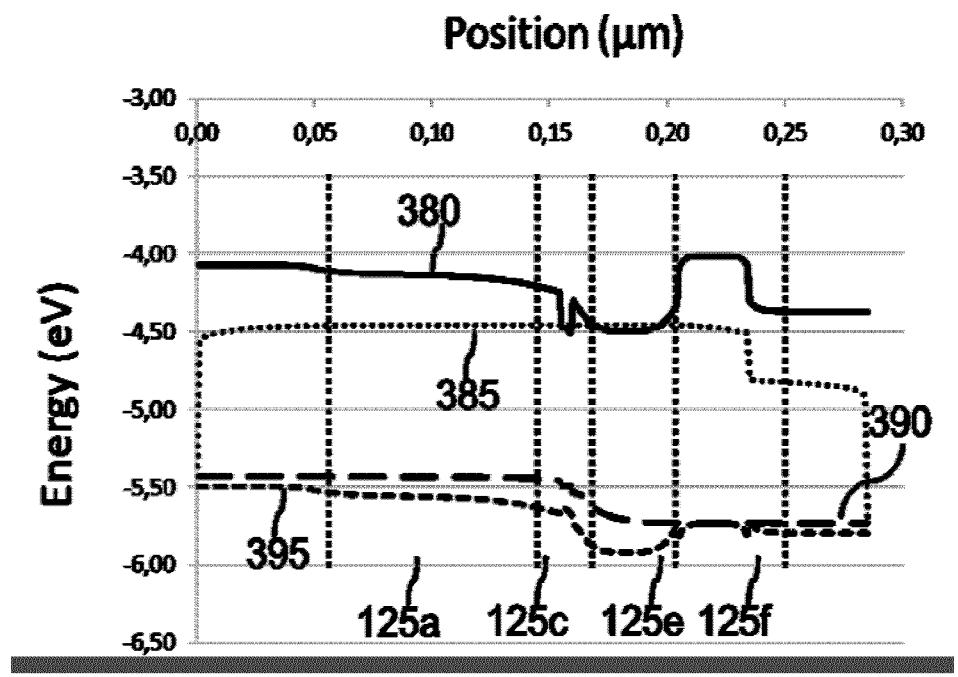
Figure 6:
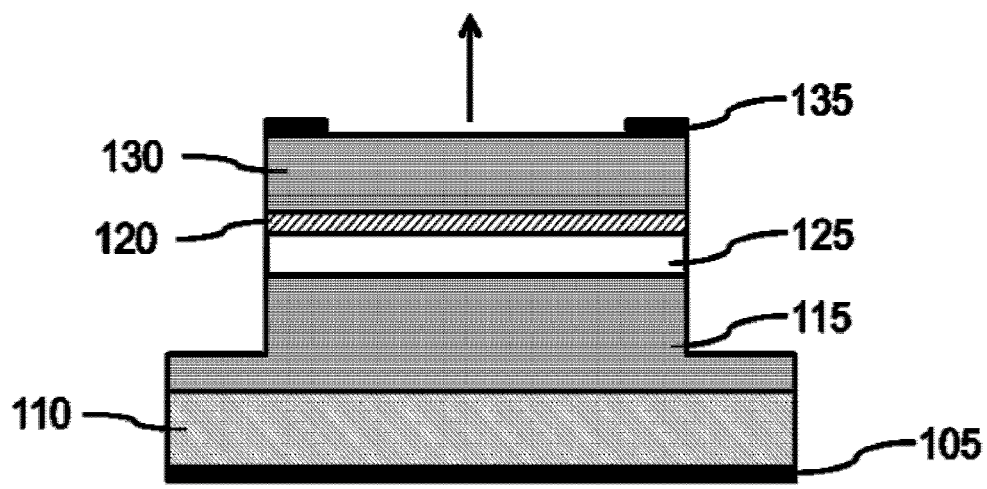
Figure 7:
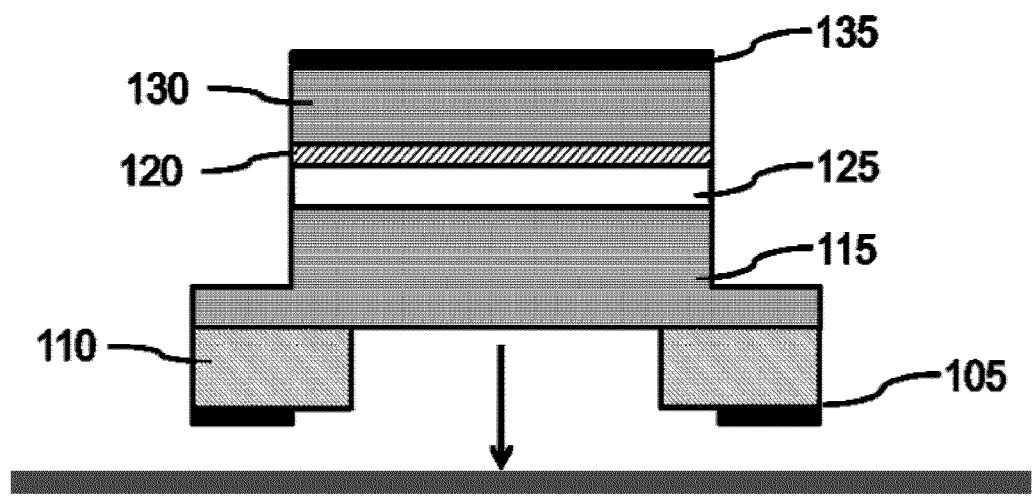
Figure 8:
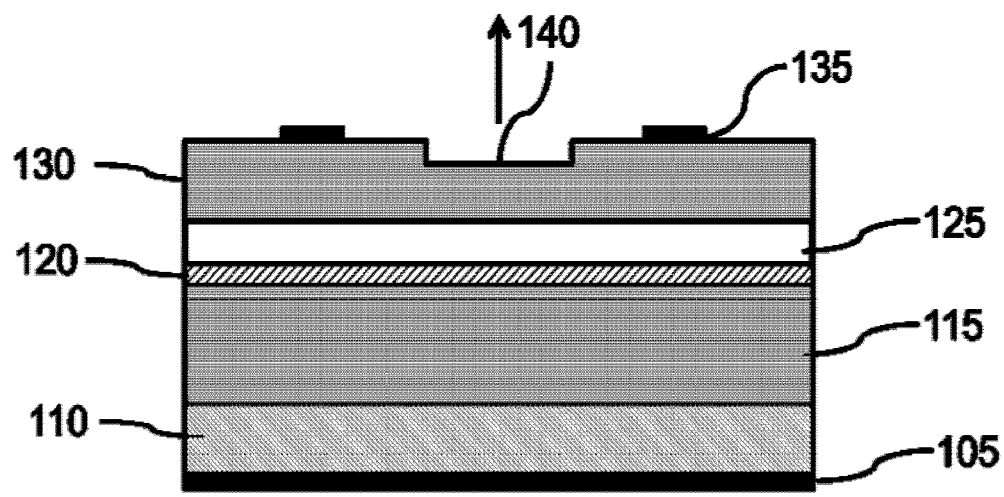
Figure 9:
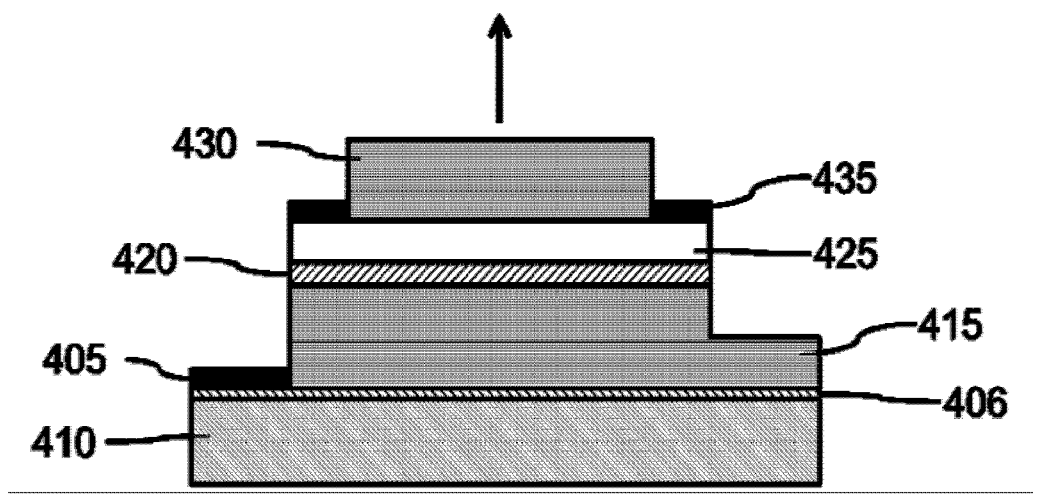
Figure 10:
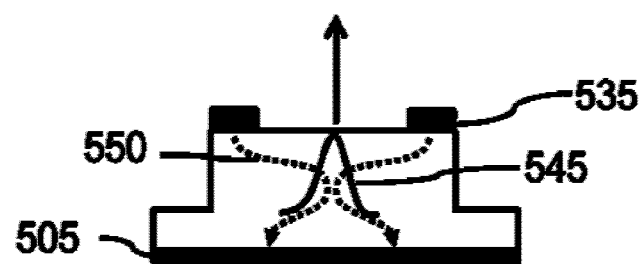
Figure 11:
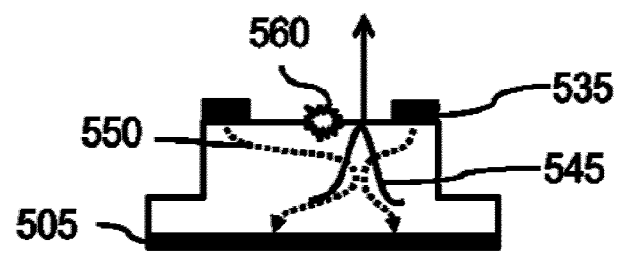
Figure 12:
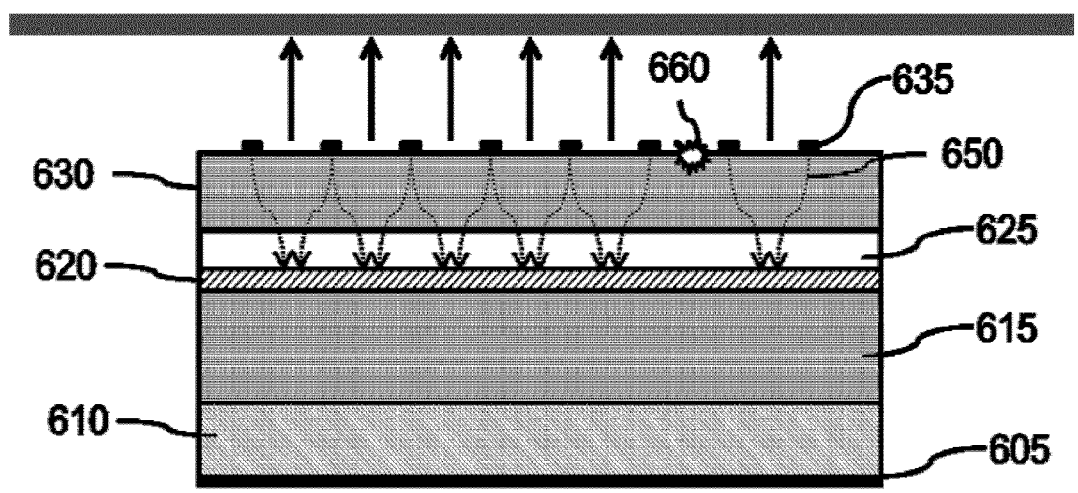
Figure 13:
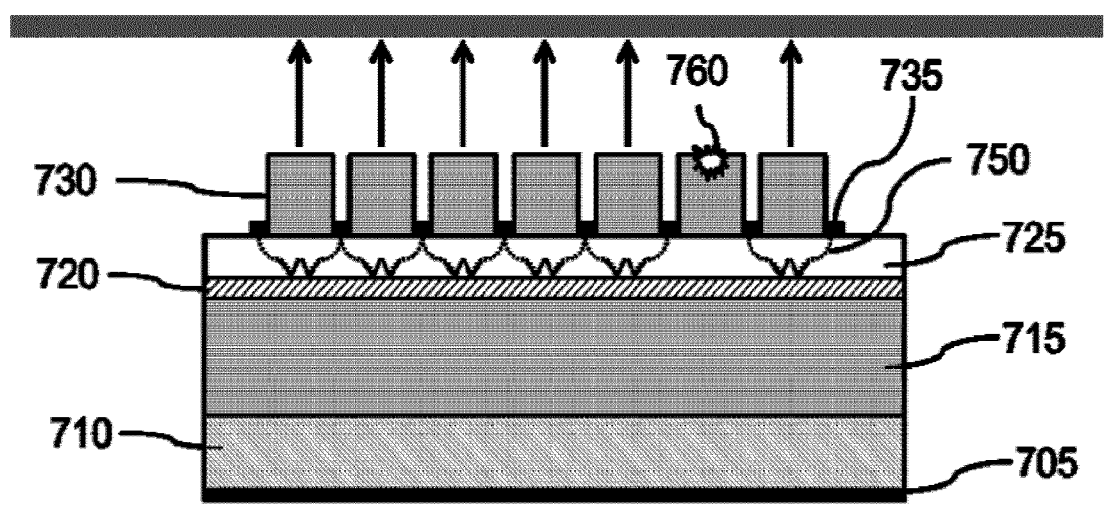
Figure 14:
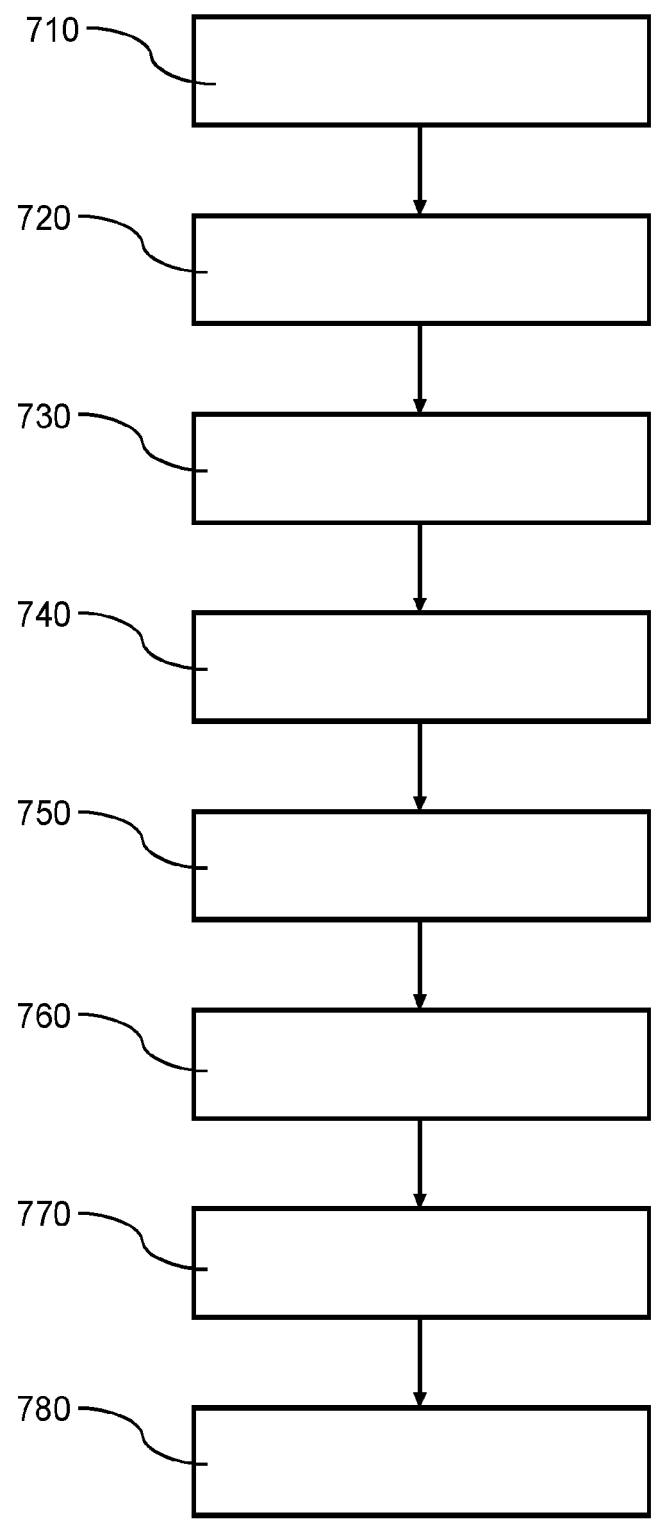

FIG. 2 shows a principal sketch of an embodiment of a layer arrangement of the distributed HBT FIG. 3 shows a principal sketch of a standing wave pattern of a VCSEL in relation to the layer arrangement of the distributed HBT FIG. 4 shows an equivalent circuit of the distributed HBT and the active layer FIG. 5 shows a graph showing a band diagram of a distributed HBT within a VCSEL FIG. 6 shows a principal sketch of a second VCSEL FIG. 7 shows a principal sketch of a third VCSEL FIG. 8 shows a principal sketch of a fourth VCSEL FIG. 9 shows a principal sketch of a fifth VCSEL FIG. 10 shows a principal sketch of a VCSEL with distributed HBT in normal operation FIG. 11 shows a principal sketch of a VCSEL with distributed HBT in operation with local defect FIG. 12 shows a principal sketch of a first laser arrangement comprising VCSELs with distributed HBT FIG. 13 shows a principal sketch of a second laser arrangement comprising VCSELs with distributed HBT FIG. 14 shows a principal sketch of a process flow of a method of fabricating a VCSEL according to the present invention In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
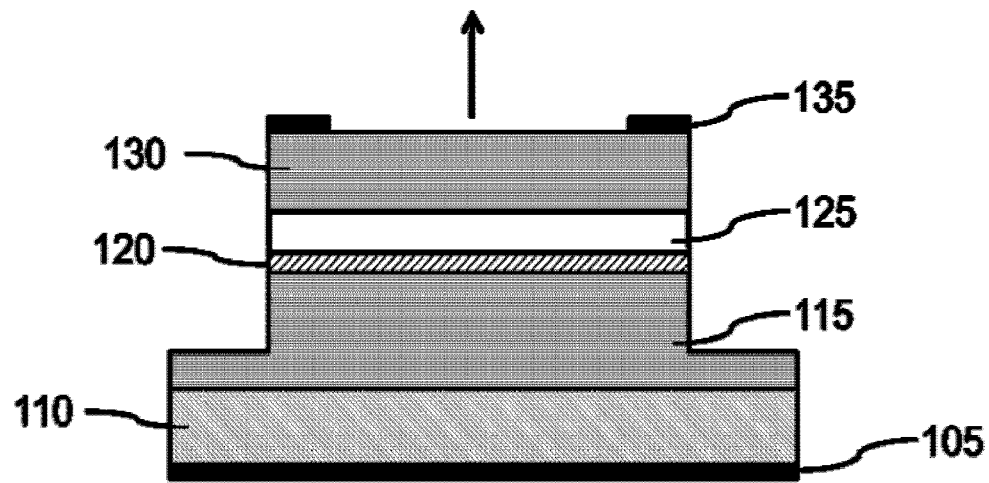

FIG. 1 shows a principal sketch of a first VCSEL with distributed HBT. The first VCSEL is a top emitting VCSEL emitting laser light in a direction away from a substrate 110. On the bottom side of the substrate 110 a first electrical contact 105 is provided. On the top side of the substrate is a first DBR 115 provided comprising 30 pairs of layers with a first and a second refractive index. The pairs of layers of the first DBR 115 comprise AlGaAs/GaAs layers. The thickness of the layers is adapted to the emission wavelength of the VCSEL in order to provide the requested reflectivity of more than 99.9%. On top of the first DBR 115 is an active layer 120 provided. The active layer 120 comprises a quantum well structure for light generation. An n-current injection layer (not shown) may be arranged between the first DBR 110 and the active layer 115. A distributed HBT 125 is provided on top of the active layer 120. A second DBR 130 is provided on top of the distributed HBT 125. The second DBR 130 comprises 15 pairs of layers which comprise AlGaAs/GaAs layers. The thickness of the pair of layers is adapted to the emission wavelength of the VCSEL in order to provide the requested reflectivity of around 95%. A ring shaped second electrical contact 135 is electrically contacted to the electrically conductive second DBR 130. The VCSEL emits laser light in the direction of the arrow via the second DBR 130. The distributed HBT 125 is arranged above the active layer 120 and is thus a pnp HBT.

FIG. 2 shows a principal sketch of an embodiment of a layer arrangement of the distributed HBT 125 which may be integrated in the first VCSEL. The distributed HBT comprises a collector layer 125a, a first intermediate layer 125b, a light sensitive layer 125c, a second intermediate layer 125d, a base layer 125e and an emitter layer 125f. The collector layer 125a comprises GaAs with a thickness of 50 nm and a concentration of Carbon atoms of $4*10^{17}$ cm$^{-3}$. The first intermediate layer 125b is arranged below the collector layer 125a and comprises a 5 nm layer of GaAs. The light sensitive layer 125c is arranged below the first intermediate layer 125b and comprises a light sensitive quantum well layer comprising $Ga_{0.73}In_{0.27}As$ with a thickness of 5 nm. The second intermediate layer 125d is arranged below the light sensitive layer 125c and comprises a 5 nm layer of GaAs. The base layer 125e is arranged below the second intermediate layer 125d and comprises GaAs with a thickness of 35 nm and a concentration of Silicon atoms of $1.5*10^{18}$ cm$^{-3}$. The emitter layer 125f is arranged below the base layer 125e and comprises $Al_{0.24}Ga_{0.76}As$ with a thickness of 25 nm and a concentration of Carbon atoms of $1.5*10^{18}$ cm$^{-3}$. The material composition of the different layers may vary in accordance with requirements of the VCSEL. The doping concentration in the collector layer has significant impact on the HBT breakdown voltage. It may thus be preferred to use a carbon doping of less than $1.5*10^{18}$ cm$^{-3}$.

The distributed HBT as shown in FIG. 2 may be integrated in the first VCSEL depicted in FIG. 1. The distributed HBT may thus be arranged just above the active layer 120. The arrangement of the active layer 120 and the distributed HBT 125 is shown together with a standing wave pattern 310 of the first VCSEL in FIG. 3. The active layer 120 is arranged in a maximum of the standing wave pattern 310. The thickness of the collector layer 125a and potential intermediate layer are arranged such that the light sensitive layer 125c is also placed in a maximum of the standing wave pattern 310 in order to enable maximum feedback between the active layer 120 and the light sensitive layer 125c. A corresponding equivalent circuit of the distributed HBT and the active layer is shown in FIG. 4. There is some optical coupling between active layer 120 and HBT layer 125 which is indicated by the arrow. As the active layer 120 needs to be put in a resonator, the coupling is not 1:1, but it depends on lateral quality of resonator how strong the actual coupling is. This leads to current filamentation and carrier confinement to the "best possible" position for the laser mode.

FIG. 5 shows a graph showing a band diagram of a distributed HBT within a VCSEL. The graph shows the conduction band 380, the Fermi level of the electrons 385, the Fermi level of the holes 390 and the valence band 395 across the different layers of the distributed HBT. The n doping by means of Silicon atoms in the base layer 125e in combination with the step in the valence band 395 of the AlGaAs emitter layer 125f hinders the holes to come from emitter layer 125f to the collector layer 125a. If the distributed HBT 125 is irradiated with some light that is absorbed in the light sensitive layer 125c (InGaAs QW) between collector layer 125a and base layer 125e, a electron-hole pair will be generated for each photon. The electron will travel to the base layer 125e and generate a forward current through the base-emitter hetero junction. This forward current will also cause a much larger hole-current (from emitter layer 125f to collector layer 125a), which is well known as transistor effect. The ratio between electron current from base to emitter and hole current from emitter layer 125f to collector layer 125a is called HBT current-amplification. High current amplifications of ~1000 may be possible with the distributed HBT structure as discussed above. There is thus a feedback loop between the active layer and the distributed HBT such that the position of the laser mode and the current mode are adapted to an optimum position with respect to each other.

FIG. 6 shows a principal sketch of a second VCSEL. The second VCSEL is a top emitting VCSEL emitting laser light in a direction away from a substrate 110. On the bottom side of the substrate 110 a first electrical contact 105 is provided. On the top side of the substrate is a first DBR 115 provided. A distributed HBT 125 is provided on top of the first DBR 115. The active layer 120 is provided on top of the distributed HBT 125. A second DBR 130 is provided on top of the active layer 120. A second electrical contact 135 is electrically contacted to the electrically conductive second DBR 130. The VCSEL emits laser light in the direction of the arrow via the second DBR 130. The active layer 120 is in this case a light sensitive bulk layer comprising InGaAs with a thickness of 12 nm. The distributed HBT 125 is arranged below the active layer 120 and is thus an npn HBT.

FIG. 7 shows a principal sketch of a third VCSEL. The third VCSEL is a bottom emitting VCSEL emitting laser light in a direction of a substrate 110. The substrate 110 is removed at the area at which the laser light is emitted. The direction of light emission is indicated by an arrow. On the bottom side of the substrate 110 a first electrical contact 105 is provided around the removed part of the substrate 110. On the top side of the substrate is a first DBR 115 provided with a reflectivity of around 95% in order to enable laser light emission via the first DBR 115. A distributed HBT 125 is provided on top of the first DBR 115. The active layer 120 is provided on top of the distributed HBT 125. A second DBR 130 is provided on top of the active layer 120 with a reflectivity of more than 99.9%. A second electrical contact 135 is electrically connected to the electrically conductive second DBR 130. The active layer 120 is in this case a light sensitive bulk layer comprising InGaAs with a thickness of 10 nm. The distributed HBT 125 is arranged below the active layer 120 and is thus an npn HBT.

FIG. 8 shows a principal sketch of a fourth VCSEL. The fourth VCSEL is a top emitting VCSEL emitting laser light in a direction away from a substrate 110. On the bottom side of the substrate 110 is a first electrical contact 105 provided. On the top side of the substrate is a first DBR 115 provided with a reflectivity of more than 99.9%. On top of the first DBR 115 is an active layer 120 provided. The active layer 120 comprises a quantum well structure for light generation. A distributed HBT 125 is provided on top of the active layer 120. A second DBR 130 is provided on top of the distributed HBT 125 with a reflectivity of around 95%. A second electrical contact 135 is electrically connected to the electrically conductive second DBR 130. The VCSEL emits laser light in the direction of the arrow via the second DBR 130. The first DBR 115, the active layer 120, the light sensitive layer 125 and the second DBR are provided in a monolithic arrangement. There is no mesa etch and the fabrication of the fourth VCSEL may thus be simplified. The second DBR 130 is locally etched at an area 140 in order to provide a higher reflectivity of the second DBR at area 140. The laser thus starts to emit laser light at the position of area 140 because of the increased resonator effect underneath of area 140. The distributed HBT 125 is arranged above the active layer 120 and is thus a pnp HBT.

FIG. 9 shows a principal sketch of a fifth VCSEL. The fifth VCSEL is a top emitting VCSEL emitting laser light in a direction away from a substrate 410. On the top side of the substrate 410 is a contacting layer 406 provided. The contacting layer 406 is electrically connected to a first electrical contact 405 which is arranged at the left side of the fifth VCSEL. A first DBR 415 with a reflectivity of more than 99.9% is arranged on top of the contacting layer 406. The contacting layer 406 distributes the current across the first DBR 415. On top of the first DBR 415 is an active layer 420 provided. The active layer 420 comprises a quantum well structure for light generation. A distributed HBT 425 is provided on top of the active layer 420. A second DBR 430 is provided on top of the distributed HBT 425 with a reflectivity of around 95%. A second ring shaped second electrical contact 435 is electrically connected to the electrically conductive HBT. The ring shaped second electrical contact 435 surrounds the second DBR 430. The second DBR comprises an alternating arrangement of $Nb_2O_5$ and $SiO_x$ layers which are electrically insulating. The VCSEL emits laser light in the direction of the arrow via the second DBR 130.

FIG. 10 shows a principal sketch of a VCSEL according to the present invention in normal operation. Electrical current flows from the second electrical contact 535 to the first electrical contact 505. An optical mode 545 at the center of the VCSEL interacts with the light sensitive layer (not shown) and increases the conductivity at the areas of highest light intensity such that current flow 550 is constricted by means of the light sensitive layer. The optical mode 545 of the Vertical Cavity Surface Emitting Laser is thus self-positioning in accordance with the current flow 550 or vice versa.

FIG. 11 shows a principal sketch of the VCSEL shown in FIG. 12 with a local defect 560. The local defect 560 is positioned at the center of the VCSEL. The local defect 560 avoids laser emission at this position. A conventional VCSEL with a current aperture would be blocked by means of the local defect 560 because the current flow is mainly determined by the current aperture.

The laser mode 545 and the current flow 550 of a VCSEL according to the present invention can shift, for example, to the right side such that laser light is emitted beside the local defect 560. The HBT of the VCSEL thus enables a kind of self repairing property by enabling a shift of the laser mode 545 and the current flow 550 to a position in which the resonator of the VCSEL works best.

FIG. 12 shows a principal sketch of a first laser arrangement comprising a multitude of VCSELs with distributed HBT. The configuration of a single VCSEL is essentially the same as the configuration of the fourth VCSEL shown in FIG. 8. On the bottom side of substrate 610 is a first electrical contact 605 provided for contacting the multitude of VCSELs. On the top side of the substrate 610 is a common first DBR 615 provided with a reflectivity of more than 99.9%. On top of the common first DBR 615 is a common active layer 620 provided. A common distributed HBT 625 is provided on top of the active layer 620. A common second DBR 630 is provided on top of the distributed HBT 625 with a reflectivity of around 95%. Second electrical contacts 635 are electrically connected to the electrically conductive second DBR 630 in order to provide an individual electrical connection of each VCSEL of the VCSEL arrangement. The VCSELs emit laser light in the direction of the arrows via the second DBR 630. The common first DBR 615, the common active layer 620, the common light sensitive layer 625 and the common second DBR 630 are provided in a monolithic arrangement. The common light sensitive layer 625 constricts the current flow 650 of each VCSEL such that the optical mode of each VCSEL fits to the respective current flow 650. The common light sensitive layer 625 even provides a local current shut off in case of a local defect 660. The electrical conductivity of the common light sensitive layer 625 will be rather low underneath of such a local defect because there is no light for opening the HBT.

FIG. 13 shows a principal sketch of a second laser arrangement comprising VCSELs with distributed HBT. The configuration of a single VCSEL is quite similar to the configuration of the fifth VCSEL shown in FIG. 9. On the bottom side of a common substrate 710 is a common first electrical contact 705 arranged for providing a common contact for the multitude of VCSELs. A common first DBR 715 with a reflectivity of more than 99.9% is arranged on top of the common substrate 710. On top of the common first DBR 715 is a common active layer 720 provided. A common distributed HBT 725 is provided on top of the common active layer 420. A common second DBR 730 is provided on top of the common distributed HBT 725 with a reflectivity of around 95%. Second electrical contacts 435 are electrically connected to the common electrically conductive HBT. The common second DBR 730 comprises an alternating arrangement of $Nb_2O_5$ and $SiO_x$ layers which are electrically insulating. The common second DBR is locally removed in order to enable access to the second electrical contacts 435. The VCSELs emit laser light in the direction of the arrow via the common second DBR 730. The common first DBR 715, the common active layer 720 and the common light sensitive layer 725 are provided in a monolithic arrangement. The common light sensitive layer 725 constricts the current flow 750 of each VCSEL such that the optical mode of each VCSEL fits to the respective current flow 750. The common light sensitive layer 725 even provides a local current shut off in case of a local defect 760. The electrical conductivity of the common light sensitive layer 725 will be rather low underneath of such a local defect because there is no light for opening the HBT.

FIG. 14 shows a principal sketch of a process flow of a method of fabricating a VCSEL according to the present invention. A first electrical contact is provided in step 710. The first electrical contact is attached to a bottom side of a GaAs substrate which is provided in step 720. A first DBR is provided on a top side of the substrate in step 730 and an active layer is provided in subsequent step 740 on top of the first DBR. A distributed heterojunction bipolar phototransistor is provided in step 750 on top of the active layer. On top of the distributed heterojunction bipolar phototransistor is a second DBR provided in step 760. A second electrical contact is provided for electrically contacting the VCSEL step 770. The distributed heterojunction bipolar phototransistor is in step 780 arranged such that there is an optical coupling between the active layer and the distributed heterojunction bipolar phototransistor for providing an active carrier confinement by means of the distributed heterojunction bipolar phototransistor such that an optical mode of the Vertical Cavity Surface Emitting Laser is self-positioning in accordance with the active carrier confinement during operation of the Vertical Cavity Surface Emitting Laser. The arrangement of the distributed heterojunction bipolar phototransistor may be performed by positioning the distributed heterojunction bipolar phototransistor within the first DBR, between the first DBR and the active layer, between the active layer and the second DBR or within the second DBR. Furthermore, the doping of the layers of the distributed heterojunction bipolar phototransistor, the thickness of the layers of the distributed heterojunction bipolar phototransistor or the current amplification of the distributed heterojunction bipolar phototransistor may be arranged to enable an optimized self-positioning of the optical mode of the VCSEL.

The layers of the first DBR, the active layer, the second, the distributed heterojunction bipolar phototransistor and any other layer as current injection layers and the like may be deposited by epitaxial methods like MOCVD.

It is the intention of the present invention to provide a VCSEL which can be easily processed by avoiding oxidation of a current aperture and optionally the mesa etch. A distributed heterojunction bipolar phototransistor is thus provided which provides an automatic alignment of the current flow and the optical mode of the VCSEL. The automatic alignment further provides a robustness with respect to local damages because the current flow and the optical mode automatically adapt to conditions of the laser resonator without constrictions which may be caused by a current aperture. The distributed HBT further enables a local shut off of a defective VCSEL by limiting the current flow across the respective VCSEL.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 105, 405, 505, 605, 705 first electrical contact
110, 410, 610, 710 substrate
115, 415, 615, 715 first distributed Bragg reflector
120, 420, 620, 720 active layer
125, 425, 625, 725 distributed heterojunction bipolar phototransistor
125a collector layer
125b first intermediate layer
125c light sensitive layer
125d second intermediate layer
125e base layer
125f emitter layer
130, 430, 630, 730 second distributed Bragg reflector
135, 435, 535, 635, 735 second electrical contact
140 area with increased reflectivity
310 standing wave pattern
380 conduction band
385 Fermi level electrons
390 Fermi level holes
395 valence band
406 contacting layer
545 optical mode
550, 650, 750 current flow
560, 660, 760 local defect
710 step of providing a first electrical contact,
720 step of providing a substrate,
730 step of providing a first distributed Bragg reflector
740 step of providing an active layer
750 step of providing a distributed heterojunction bipolar phototransistor
760 step of providing a second distributed Bragg reflector
770 step of providing a second electrical contact
780 step of arranging the distributed heterojunction bipolar phototransistor

The invention claimed is:

1. A Vertical Cavity Surface Emitting Laser comprising a first electrical contact, a substrate, a first distributed Bragg reflector, an active layer, a distributed heterojunction bipolar phototransistor, a second distributed Bragg reflector and a second electrical contact, the distributed heterojunction bipolar phototransistor comprising a collector layer, a light sensitive layer, a base layer and an emitter layer, wherein the distributed heterojunction bipolar phototransistor is arranged such that there is an optical coupling between the active layer and the distributed heterojunction bipolar phototransistor for providing an active carrier confinement by means of the distributed heterojunction bipolar phototransistor such that an optical mode of the Vertical Cavity Surface Emitting Laser is self-positioning in accordance with the active carrier confinement during operation of the Vertical Cavity Surface Emitting Laser, wherein the concentration of dopants in the collector layer, the base layer and the emitter layer is less than $10^{19}$ cm$^{-3}$, and wherein a ratio between an electron current from the base layer to emitter layer and a hole current from emitter layer to collector layer of the distributed heterojunction bipolar phototransistor is at least 100.

2. The Vertical Cavity Surface Emitting Laser according to claim 1, wherein the thickness of the base layer is less than 100 nm.

3. The Vertical Cavity Surface Emitting Laser according to claim 1, wherein the distributed heterojunction bipolar phototransistor is arranged to be electrically conductive without light emission of the Vertical Cavity Surface Emitting Laser at a defined threshold voltage such that light emission of the Vertical Cavity Surface Emitting Laser can be initiated by applying a voltage equal to or above the threshold voltage.

4. The Vertical Cavity Surface Emitting Laser according to claim 3, wherein the threshold voltage is determined by an emitter-collector breakdown voltage of the distributed heterojunction bipolar phototransistor, and wherein the emitter-collector breakdown voltage is equal to or less than 10 V.

5. The Vertical Cavity Surface Emitting Laser according to claim 1, wherein the first distributed Bragg reflector or the second distributed Bragg reflector is arranged such that there is no current flow through the first distributed Bragg reflector or the second distributed Bragg reflector during operation of the Vertical Cavity Surface Emitting Laser.

6. The Vertical Cavity Surface Emitting Laser according to claim 1, wherein the distributed heterojunction bipolar phototransistor is arranged between the active layer and the second distributed Bragg reflector and an reflectivity of the second distributed Bragg reflector is arranged such that laser light is emitted via the second distributed Bragg reflector during operation of the Vertical Cavity Surface Emitting Laser.

7. The Vertical Cavity Surface Emitting Laser according to claim 1, wherein the distributed heterojunction bipolar phototransistor is arranged between the first distributed Bragg reflector and the active layer, and an reflectivity of the first distributed Bragg reflector is arranged such that laser light is emitted via the first distributed Bragg reflector during operation of the Vertical Cavity Surface Emitting Laser.

8. A laser arrangement comprising at least two Vertical Cavity Surface Emitting Lasers according to claim, wherein the Vertical Cavity Surface Emitting Lasers share the first distributed Bragg reflector and the second distributed Bragg reflector such that the second electrical contacts of the Vertical Cavity Surface Emitting Lasers are arranged on a common surface.

9. The laser arrangement according to claim 8, wherein a reflectivity of the second distributed Bragg reflector is locally increased at at least two different areas of the second distributed Bragg reflector such that during operation the Vertical Cavity Surface Emitting Lasers start lasing at the areas of increased reflectivity.

10. The laser arrangement according to claim 9, wherein a grating is provided at the areas of increased reflectivity such that polarization stable single mode emission of the Vertical Cavity Surface Emitting Lasers is enabled.

11. A laser arrangement comprising at least two Vertical Cavity Surface Emitting Lasers according to claim 7, wherein the Vertical Cavity Surface Emitting Lasers share the distributed heterojunction bipolar phototransistor.

12. A method of fabricating a Vertical Cavity Surface Emitting Laser, the method comprising the steps of:

providing a first electrical contact, providing a substrate, providing a first distributed Bragg reflector, providing an active layer, providing a distributed heterojunction bipolar phototransistor comprising a collector layer, a light sensitive quantum well layer, a base layer and an emitter layer, wherein the concentration of dopants in the collector layer, the base layer and the emitter layer is less than $10^{19}$ cm$^{-3}$, providing a second distributed Bragg reflector, providing a second electrical contact, arranging the heterojunction bipolar phototransistor such that there is an optical coupling between the active layer and the heterojunction bipolar phototransistor for providing an active carrier confinement by means of the heterojunction bipolar phototransistor such that an optical mode of the Vertical Cavity Surface Emitting Laser is self-positioning in accordance with the active carrier confinement during operation of the Vertical Cavity Surface Emitting Laser, and arranging a ratio between an electron current from the base layer to emitter layer and a hole current from emitter layer to collector layer of the distributed heterojunction bipolar phototransistor is at least 100.

* * * * *